(12) United States Patent
Arsovski et al.

(10) Patent No.: US 8,218,378 B2
(45) Date of Patent: Jul. 10, 2012

(54) WORD-LINE LEVEL SHIFT CIRCUIT

(75) Inventors: Igor Arsovski, Williston, VT (US); Matthew W. Deming, Essex Junction, VT (US); Darryl R. Hill, Colchester, VT (US); Harold Pilo, Underhill, NY (US); Reid A. Wistort, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 367 days.

(21) Appl. No.: 12/579,089

(22) Filed: Oct. 14, 2009

(65) Prior Publication Data

US 2011/0085390 A1   Apr. 14, 2011

(51) Int. Cl.
*G11C 8/08* (2006.01)
(52) U.S. Cl. .................. 365/189.11; 365/230.06
(58) Field of Classification Search .............. 365/185.23, 365/154, 230.06, 189.11
See application file for complete search history.

(56) References Cited

U.S. PATENT DOCUMENTS

| 5,633,832 | A  | * | 5/1997  | Patel et al. ............... 365/230.06 |
| 5,636,175 | A  | * | 6/1997  | McLaury ................. 365/230.06 |
| 6,535,430 | B2 | * | 3/2003  | Ogura et al. ............. 365/185.23 |
| 6,603,703 | B2 |   | 8/2003  | Lines |
| 6,639,424 | B2 |   | 10/2003 | Bales |
| 7,038,937 | B2 |   | 5/2006  | Lines |
| 7,345,946 | B1 | * | 3/2008  | Chapman et al. ........ 365/230.06 |
| 7,355,447 | B2 |   | 4/2008  | Wood et al. |
| 2006/0023521 | A1 | * | 2/2006  | Gabric et al. ............ 365/189.11 |
| 2007/0133317 | A1 | * | 6/2007  | Yuan et al. ............... 365/189.09 |
| 2007/0206397 | A1 | * | 9/2007  | Arsovski et al. ................ 365/49 |
| 2007/0222478 | A1 |   | 9/2007  | Chen |
| 2007/0247209 | A1 |   | 10/2007 | Chen |
| 2008/0031060 | A1 | * | 2/2008  | Choi et al. ............... 365/189.11 |
| 2009/0116307 | A1 | * | 5/2009  | Cottier et al. ............ 365/189.11 |

* cited by examiner

*Primary Examiner* — Douglas King
(74) *Attorney, Agent, or Firm* — David A. Cain; Hoffman Warnick LLC

(57) ABSTRACT

A dual word-line level shifter circuit and associated SRAM. A circuit is disclosed that includes a first transistor gated by a data input at the lower voltage, and a second transistor gated by a restore input at the higher voltage, wherein the first and second transistors are coupled along a series path to a source at the higher voltage; a control node along the series path; an output node coupled to the control node via a first pair of parallel transistors; and a feedback circuit having a second pair of parallel transistors and a feedback transistor, wherein the feedback transistor couples the second pair of parallel transistors to the control node and is gated by the output node.

18 Claims, 4 Drawing Sheets

WORD-LINE LEVEL SHIFT CIRCUIT

FIELD OF THE INVENTION

This disclosure is related to a voltage level shifter circuit, and more particularly to a level shifter circuit for use in an SRAM device for converting word-line select VDD voltage levels to VCS voltage levels.

BACKGROUND OF THE INVENTION

SRAM (static random access memory) devices are commonly utilized for static memory storage. As semiconductors move into deep sub-micron technologies there is constant demand for denser memories that also demand low power. Since the minimum voltage for a reliable operation of an SRAM cell voltage is not scaling as fast as the logic, modern SRAMs are now operating with dual power supplies. One power supply VDD (e.g., 0.8 volts) is used to power the SRAM periphery, while another power supply VCS (1.4 volts) is used to power up the memory array including the memory cells. Since the differential between these two power domains is growing, voltage level shifters are needed to accommodate the growing VDD/VCS skew.

Previous level shifters (both dynamic and static) either cannot satisfy the two directional voltage skew, add significant delay to perform the voltage level translation, or require a large area to implement this function.

SUMMARY OF THE INVENTION

Disclosed is a word-line level shifter circuit and associated SRAM capable of tolerating wide voltage differentials between a first power supply voltage and a second power supply voltage. The level shifter circuit uses a quasi-feedback circuit in which unselected inputs in the first power supply domain are utilized to break the feedback of the second power supply domain.

In a first aspect, the invention provides a level shifter for shifting word-line select signals from a lower voltage to a higher voltage, comprising: a plurality of dual word-line level shifter circuits, wherein each dual word-line level shifter circuit comprises: a first transistor gated by a word-line select input that is driven at the lower voltage, and a second transistor gated by a restore input that is driven at the higher voltage, wherein the first and second transistors are coupled along a series path to a source at the higher voltage; a control node along the series path that is driven to ground upon activation of the word-line select input and is driven to the higher voltage upon activation of the restore input; an output node that is driven to the higher voltage in response to the control node being at ground and is driven to ground in response to the control node being at the higher voltage; and a feedback circuit that maintains the control node at the higher voltage in response to the word-line select input being de-activated.

In a second aspect, the invention provides an SRAM device, comprising: a plurality of word-line level shifter circuits for shifting word-line select signals from a lower voltage to a higher voltage, wherein each word-line level shifter circuit comprises: a first transistor gated by a word-line select input that is driven at the lower voltage, a second transistor gated by a restore input that is driven at the higher voltage, and a third transistor gated by a word-line decode input, wherein the first, second and third transistors are coupled along a series path to a source at the higher voltage; a control node along the series path that is driven to ground upon activation of the word-line select input and the word-line decode input, and is driven to the higher voltage upon activation of the restore input; an output node that is driven to the higher voltage in response to the control node being at ground and is driven to ground in response to the control node being at the higher voltage; and a feedback circuit that maintains the control node at the higher voltage in response to the word-line select input being de-activated; and a shared level shifter that generates the restore input for each of the plurality of word-line level shifter circuits.

In a third aspect, the invention provides a level shifter circuit for shifting a data signal from a lower voltage to a higher voltage, comprising: a first transistor gated by a data input at the lower voltage, and a second transistor gated by a restore input at the higher voltage, wherein the first and second transistors are coupled along a series path to a source at the higher voltage; a control node along the series path; an output node coupled to the control node via a first pair of parallel transistors; and a feedback circuit having a second pair of parallel transistors and a feedback transistor, wherein the feedback transistor couples the second pair of parallel transistors to the control node and is gated by the output node.

The illustrative aspects of the present invention are designed to solve the problems herein described and other problems not discussed.

BRIEF DESCRIPTION OF THE DRAWINGS

These and other features of this invention will be more readily understood from the following detailed description of the various aspects of the invention taken in conjunction with the accompanying drawings.

Figure 1:
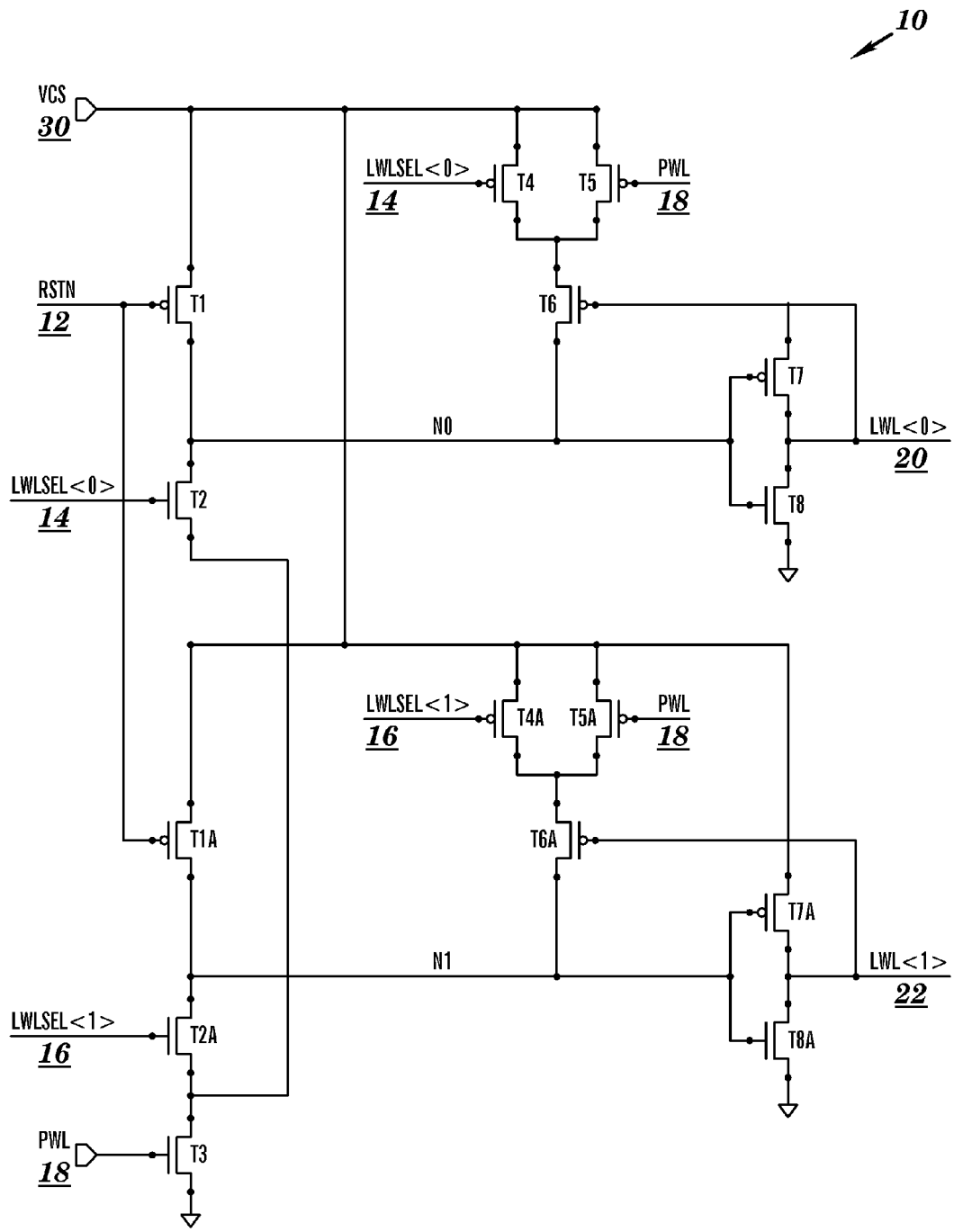
FIG. 1 depicts a dual word-line level shifter in accordance with an embodiment of the present invention.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

FIG. 1 depicts a dual word-line level shifter circuit 10 for converting word-line select signals in a lower VDD voltage domain to word-line select signals in a higher VCS voltage domain. Dual word-line level shifter circuit 10 level is configured for selectively shifting word-line select signals along two input lines. Accordingly, in an SRAM configuration containing 128 word-lines, there would be 64 dual word-line level shifter circuits 10, i.e., 64 total circuit blocks. However, it is understood that the level shifting technique described herein could be implemented for any number or type of circuit blocks or data signal inputs.

There are essentially four inputs to the level shifter circuit 10, including: (1) a word-line decode input PWL 18, which determines which of the 64 circuit blocks is to be selected; (2) a pair of word-line select inputs (LWLSEL<0> and LWLSEL<1>) 14, 16 for determining which of the two word-lines in circuit 10 are to be selected; and (3) a restore input (RSTN) 12 which is shared by each of the 64 circuit blocks. PWL 18 and word-line select inputs LWLSEL<0> and LWLSEL<1> 14, 16 receive signals in the VDD voltage domain. Level shifted word-line select outputs (LWL<0> and LWL<1>) 20, 22 are generated in the higher VCS voltage domain.

As described with reference to FIG. 2, restore input (RSTN) 12 receives its signal in the higher VCS voltage domain. However, since the signal is shared by each of the 64 circuit blocks, a single shared level shifter 32 (FIGS. 2 and 3) can be utilized to drive the RSTN 12 signal for each circuit block.

As shown in FIG. 1, dual word-line level shifter circuit 10 includes a top portion for level shifting a VDD signal on LWLSEL<0> 14 and a complimentary bottom portion for level shifting a VDD signal on LWLSEL<1> 16. Referring to the top portion, i.e., LWLSEL<0> 14, of circuit 10, it is initially noted that a VCS supply 30 is provided to transistors T1, T4, and T5. Transistors T1 (PFET), T2 (NFET), and T3 (NFET) are connected in series to the VCS supply 30 and ground. T1 is gated by the restore signal 12, T2 is gated by word-line select signal LWLSEL<0> 14, and T3 is gated by PWL 18. A control node N0 couples T1 and T2 to an output node LWL<0> 20 via driver transistors T7 (PFET) and T8 (NFET). Accordingly, it can be appreciated that the signal path for shifting word-line select signal LWLSEL<0> 14 requires traversing only two transistors.

Transistors T4 (PFET), T5 (PFET) and T6 (PFET) form a feedback circuit. In particular, feedback transistors T4 and T5 are gated by word-line select signal LWLSEL<0> 14 and PWL 18. Feedback transistor T6 is gated by the output node LWL<0> 20 and connects parallel feedback transistors T4 and T5 to the control node N0.

Assuming word-line select signal LWLSEL<0> 14 is selected (i.e., activated), along with PWL 18, the circuit operates as follows. When RSTN 12 transitions from 0 to VCS, T1 and T1A are completely turned off. Because T1 is connected to VCS 30, a VCS signal (i.e., RSTN 12) at its gate is required to shut it completely off, i.e., a lower VDD signal would not suffice.

When LWLSEL<0> 14 goes to VDD, control node N0 goes to ground and output node LWL<0> 20 goes to VCS via T7. A feedback is provided to T6 which cuts off T6 when the output node LWL<0> 20 is at VCS. However, when LWLSEL<0> 14 is not selected (i.e., de-activated), LWL<0> goes to ground via T8, T6 is activated, and node N0 goes to VCS via T4, which ensures that LWL<0> remains at ground, i.e., unselected.

The bottom half of the circuit 10 operates in the same manner. Namely, node N1 is driven low when LWLSEL<1> 16 goes to VDD, which causes VCS to be generated at output node LWL<1> 22. When LWLSEL<1> 16 goes low, and output node LWL<1> 22 is driven low, feedback opens transistor T6A, and control node N1 goes to VCS via T4A.

The level shifter circuit 10 accordingly uses a quasi-feedback circuit in which the unselected input in the VDD domain is utilized to break the feedback of the VCS supply domain.

Figure 2:
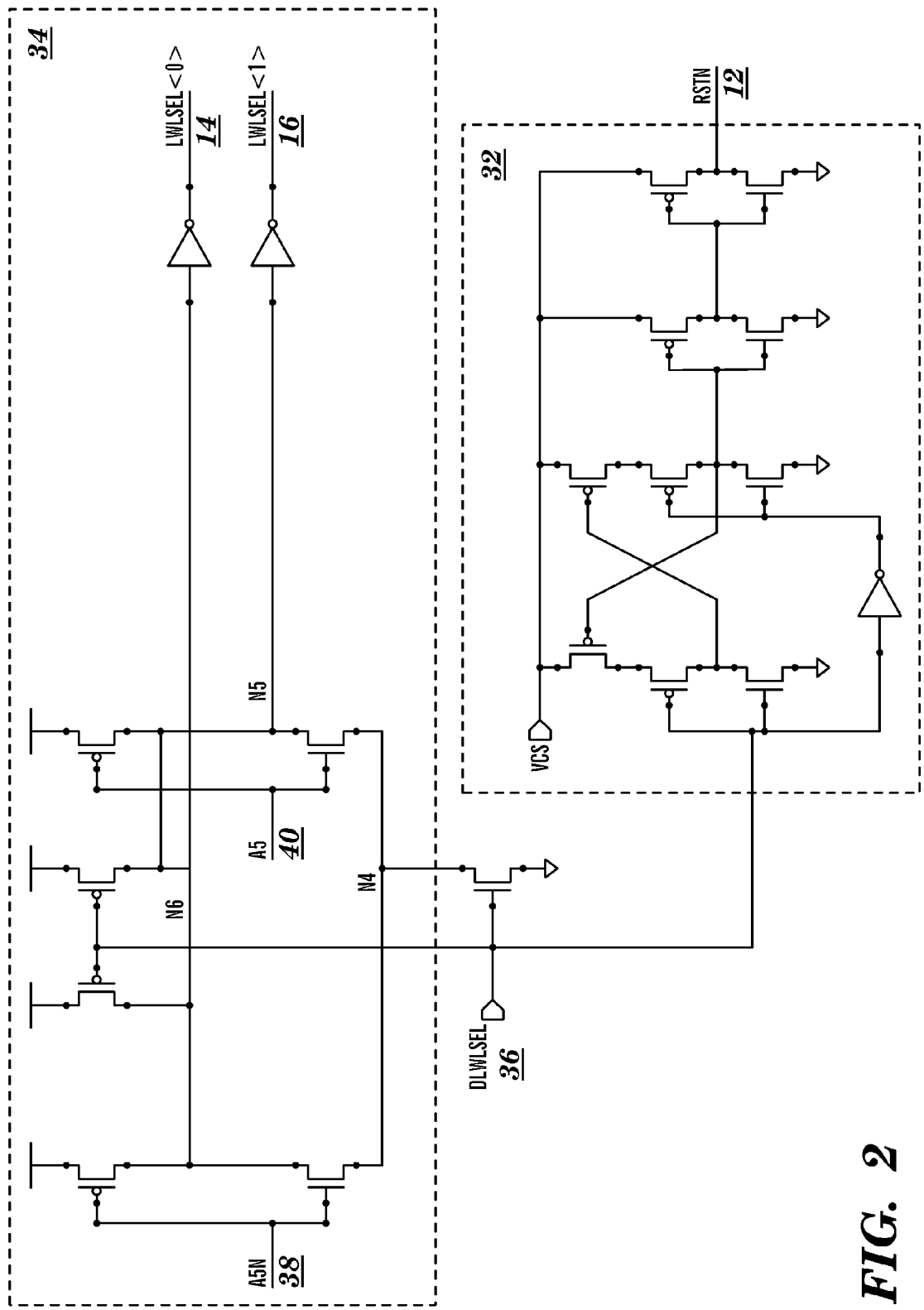
FIG. 2 depicts a local word-line select circuit and a shared level shifter circuit in accordance with an embodiment of the present invention.

FIG. 2 depicts a word-line select circuit 34 for driving the word-line select inputs 14, 16 (in the VDD domain), as well as a shared level shifter 32 for providing the restore (RSTN) signal 12 (in the VCS domain). A DLWLSEL input 36 is utilized to activate both the word-line select circuit 34 and the shared level shifter 32. In this example, word-line select circuit 34 handles address inputs A5N 38 and A5 40.

Shared level shifter 32 may be implemented using any type of level shifter for converting a VDD domain signal to a VCS domain signal. In this case, any time DLWLSEL 36 goes to VDD (indicating a line select is occurring somewhere), RSTN 12 is outputted in the VCS domain. Note that unlike the dual word-line level shifter 10 described above, the only input signal to the shared level shifter is in the VDD domain.

Figure 3:
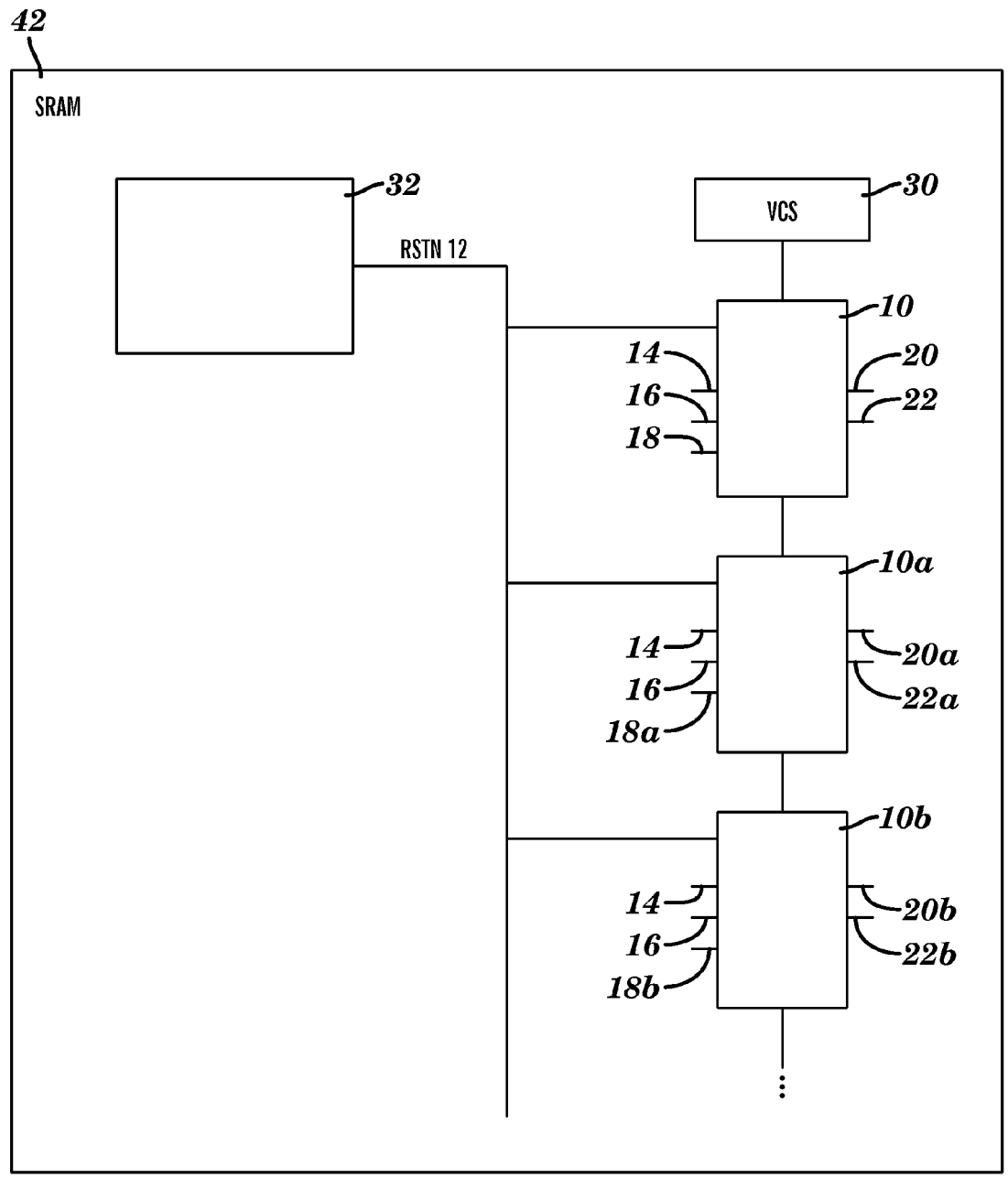
FIG. 3 depicts an SRAM device having a level shifter configuration in accordance with an embodiment of the present invention.

FIG. 3 depicts an SRAM device 42 having a level shifter configuration that includes a shared level shifter 32 and a plurality of dual word-line level shifters 10, 10a, 10b, etc. As can be seen, each dual word-line level shifter 10, 10a, 10b, etc., receives the RSTN signal 12 from the shared level shifter 32. Each dual line level shifter includes shared word select inputs 14 and 16; PWL inputs 18, 18a, 18b; and line word-line select outputs 20 and 22, 20a and 22a, 20b and 22b, etc.

It should be appreciated that this configuration greatly reduces the number of transistors required in a typical SRAM device. In this embodiment, each dual word-line level shifter 10, 10a, 10b is implemented with 15 transistors. The other required devices in share level shifter 32 are shared among each circuit block 10, 10a, 10b, etc., thus creating little extra overhead. In addition, circuit delay is greatly reduced since, as shown in FIG. 1, there are only two transistors (T2 and T7) in the word-line select signal path between the VDD domain and the VCS domain.

Figure 4:
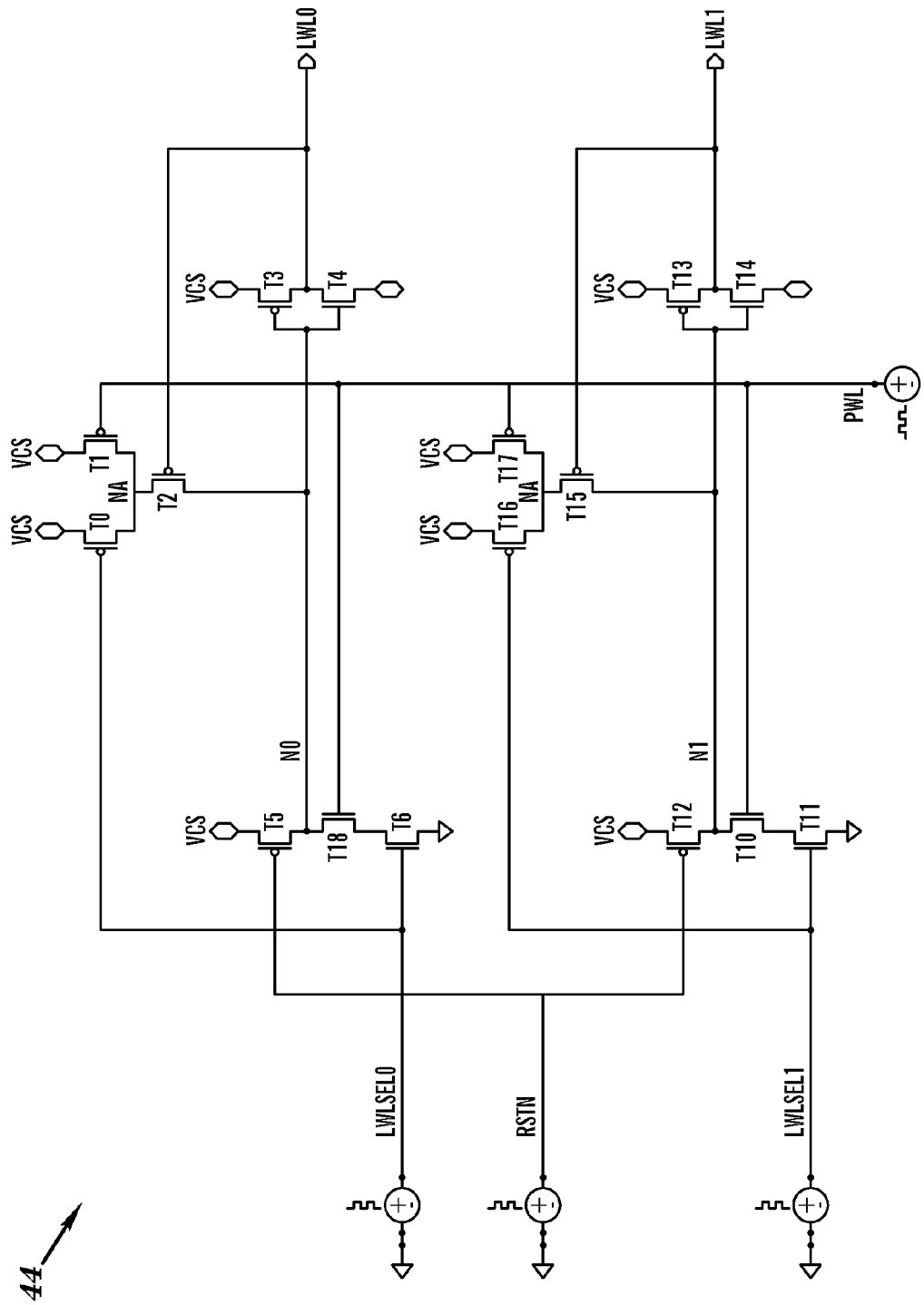
FIG. 4 depicts an alternative embodiment of a level shifter circuit in accordance with an embodiment of the present invention.

FIG. 4 depicts an alternative embodiment for a dual word-line level shifter circuit 44. Circuit 44 requires 16 total transistors.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A level shifter for shifting word-line select signals from a lower voltage to a higher voltage, comprising: a plurality of dual word-line level shifter circuits, wherein each dual word-line level shifter circuit comprises: a first transistor gated by a word-line select input that is driven at the lower voltage, a second transistor gated by a restore input that is driven at the higher voltage, and a third transistor gated by a word-line decode input, wherein the first, second and third transistors are coupled along a series path to a source at the higher voltage; a control node along the series path that is driven to ground upon activation of the word-line select input and driven to the higher voltage upon activation of the restore input; an output node that is driven to the higher voltage in response to the control node being at ground and is driven to ground in response to the control node being at the higher voltage; and a feedback circuit that maintains the control node at the higher voltage in response to the word-line select input being deactivated.

2. The level shifter of claim 1, further comprising:
a shared level shifter that generates the restore input for each of the plurality of dual word-line level shifter circuits.

3. The level shifter of claim 1, wherein the feedback circuit includes a pair of parallel transistors gated by the word-line select input and the word-line decode input.

4. The level shifter of claim 3, further comprising a feedback transistor coupled to the pair of parallel transistors and the control node, wherein the feedback transistor is gated by the output node.

5. The level shifter of claim 1, wherein each dual word-line level shifter circuit comprises a second set of devices for controlling a second word-line select input.

6. The level shifter of claim 1, wherein each dual word-line level shifter circuit is coupled to a word-line select circuit.

7. An SRAM device, comprising:
a plurality of word-line level shifter circuits for shifting word-line select signals from a lower voltage to a higher voltage, wherein each word-line level shifter circuit comprises:
  a first transistor gated by a word-line select input that is driven at the lower voltage, a second transistor gated by a restore input that is driven at the higher voltage, and a third transistor that is gated by a word-line decode input, wherein the first, second and third transistors are coupled along a series path to a source at the higher voltage;
  a control node along the series path that is driven to ground upon activation of the word-line select input and the word-line decode input, and is driven to the higher voltage upon activation of the restore input;
  an output node that is driven to the higher voltage in response to the control node being at ground and is driven to ground in response to the control node being at the higher voltage; and
  a feedback circuit that maintains the control node at the higher voltage in response to the word-line select input being de-activated; and
a shared level shifter that generates the restore input for each of the plurality of word-line level shifter circuits.

8. The SRAM device of claim 7, wherein the first transistor comprises a PFET, the second transistor comprises an NFET and the third transistor comprises an NFET.

9. The SRAM device of claim 8, wherein the feedback circuit includes a pair of parallel transistors gated by the word-line select input and the decode signal.

10. The SRAM device of claim 9, further comprising a feedback transistor coupled to the pair of parallel transistors and the control node, wherein the feedback transistor is gated by the output node.

11. The SRAM device of claim 7, wherein each word-line level shifter circuit is integrated with a second set of devices for controlling a complimentary word-line select input.

12. The SRAM device of claim 7, further comprising a word-line select circuit.

13. A level shifter circuit for shifting a data signal from a lower voltage to a higher voltage, comprising: a first transistor gated by a data input at the lower voltage, a second transistor gated by a restore input at the higher voltage, and a third transistor gated by a word-line decode input, wherein the first, second and third transistors are coupled along a series path to a source at the higher voltage; a control node along the series path; an output node coupled to the control node via a first pair of driver transistors; and a feedback circuit having a second pair of parallel transistors and a feedback transistor, wherein the feedback transistor couples the second pair of parallel transistors to the control node and is gated by the output node.

14. The level shifter of claim 13, further comprising a second level shifter that generates the restore input.

15. The level shifter of claim 13, wherein the second pair of parallel transistors is gated by the data input and the word-line decode input.

16. The level shifter of claim 15, wherein the feedback transistor comprises a PFET.

17. The level shifter of claim 13, further comprising a second set of devices for controlling a second data input.

18. The level shifter of claim 13, wherein the data line is coupled to a word-line select circuit.

* * * * *